United States Patent
Kopp et al.

(10) Patent No.: US 9,166,091 B2
(45) Date of Patent: Oct. 20, 2015

(54) PIN STRUCTURE SEMICONDUCTOR OPTICAL RECEIVER

(71) Applicant: Commissariat a l'energie atomique et aux energies alternatives, Paris (FR)

(72) Inventors: Christophe Kopp, Fontanil-Cornillon (FR); Jean-Marc Fedeli, Saint-Egreve (FR); Sylvie Menezo, Voiron (FR)

(73) Assignee: COMMISSARIAT A L'ÉNERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/922,566

(22) Filed: Jun. 20, 2013

(65) Prior Publication Data

US 2013/0344643 A1 Dec. 26, 2013

(30) Foreign Application Priority Data

Jun. 20, 2012 (FR) ...................... 12 55772

(51) Int. Cl.
| H01L 21/00 | (2006.01) |
| H01L 31/105 | (2006.01) |
| H01L 31/0352 | (2006.01) |
| H01L 31/0336 | (2006.01) |

(52) U.S. Cl.
CPC ...... *H01L 31/105* (2013.01); *H01L 31/035281* (2013.01); *H01L 31/0336* (2013.01); *Y02E 10/50* (2013.01)

(58) Field of Classification Search
None
See application file for complete search history.

(56) References Cited

U.S. PATENT DOCUMENTS

| 6,515,315 | B1* | 2/2003 | Itzler et al. .................... 257/186 |
| 6,841,807 | B2* | 1/2005 | Kang ............................. 257/184 |
| 6,897,471 | B1* | 5/2005 | Soref et al. ...................... 257/22 |
| 7,233,051 | B2* | 6/2007 | Morse et al. .................. 257/438 |
| 7,259,444 | B1* | 8/2007 | Chen et al. ..................... 257/656 |
| 7,525,170 | B2* | 4/2009 | Hsu et al. ...................... 257/458 |
| 2004/0108516 | A1* | 6/2004 | Kang ............................. 257/184 |
| 2004/0157354 | A1* | 8/2004 | Kuriyama et al. ............... 438/45 |
| 2005/0173712 | A1 | 8/2005 | Nakajima |
| 2006/0060933 | A1* | 3/2006 | Gao et al. ...................... 257/458 |
| 2006/0076589 | A1* | 4/2006 | Gao et al. ...................... 257/292 |
| 2008/0265357 | A1* | 10/2008 | Toyonaka et al. ............. 257/436 |
| 2011/0180894 | A1* | 7/2011 | Samuelson et al. ........... 257/438 |
| 2011/0309240 | A1* | 12/2011 | Yu et al. ..................... 250/214.1 |

FOREIGN PATENT DOCUMENTS

EP 0314372 5/1989

* cited by examiner

*Primary Examiner* — Benjamin Sandvik
*Assistant Examiner* — Herve Assouman
(74) *Attorney, Agent, or Firm* — Occhiuti & Rohlicek LLP

(57) ABSTRACT

A PIN structure semiconductor optical receiver includes first and second electrical contact layers and an intrinsic layer disposed between them. The intrinsic layer includes a stud having a stud axis and a stud cross-section. The first and second contact layers have dimensions in a plane perpendicular to the stud axis that are greater than the stud's cross-section. These layers are also elongated and have longitudinal axes offset angularly relative to each other to minimize facing areas of said electrical contact layers.

20 Claims, 8 Drawing Sheets

PIN STRUCTURE SEMICONDUCTOR OPTICAL RECEIVER

CROSS-REFERENCE TO RELATED APPLICATIONS

Under 35 USC 119, this application claims the benefit of the priority date of French Patent Application 12/55,772, filed Jun. 20, 2012, the content of which is herein incorporated by reference.

FIELD OF DISCLOSURE

The present invention concerns a PIN structure semiconductor optical receiver that may notably be used for the optical transmission of data at high bit rates.

BACKGROUND

Fiber optic communications generally use modulated light sources, such as a laser, an optical receiver, notably a photodiode, and an optical fiber connecting the light source and the optical receiver. In this context, the laser emits pulses carrying data to be transported that will be received by the receiver, which converts these optical signals into electrical signals.

PIN structure photodiodes are generally used, which in particular comprise three layers: a p-doped electrical contact layer, an n-doped electrical contact layer and an intrinsic layer disposed between the two layers.

The p-doped and n-doped electrical contact layers are connected to respective metal contacts in the form of rings.

The intrinsic layer is in the form of a stud (also referred to as a mesa in the literature), for example in germanium, that absorbs incident light to convert it into a photocurrent or an electrical current.

Such a stud typically has a cylindrical shape of circular cross section and a diameter exceeding 10 µm in order to match the dimensions of the incident beam, which generally comes from an optical fibre.

The metal ring forming the metal contact in contact with the upper electrical contact layer generally has a diameter smaller than the diameter of the stud. Metal being opaque at the wavelengths concerned (near infrared: 850 nm to 1600 nm), this ring therefore masks some of the incident light, which reduces the performance/sensitivity of the photodiode.

To enhance the performance of such a photodiode, increasing the diameter of the stud of the intrinsic layer might be envisaged.

However, it is important that the diameter of the stud remain small, because it defines the capacitance of the photodiode and thus its bandwidth.

The smaller the diameter of the stud, the smaller the capacitance of the photodiode and the greater the bandwidth of the photodiode.

It would therefore be necessary to combine two mutually contradictory requirements, namely on the one hand to minimize the diameter of the mesa in order to optimize the bandwidth of the photodiode and on the other hand to maximize the diameter of the metal contact ring in order to optimize the sensitivity of the photodiode.

This problem has become particularly apparent with the broadening of the bandwidth to more than 10 GHz (i.e. 25 GHz, 40 GHz) although the diameter of the beam that illuminates the photodiode remains constant at 10-12 µm, being imposed by the standard for monomode fibres for optical telecommunication applications.

A partial solution to this problem is proposed in the document US2008/0265357.

As notably seen in FIG. 3 of that document, the upper electrical contact layer has a larger diameter than the intrinsic layer, which enables the use of a metal ring of larger diameter that no longer masks part of the stud of the intrinsic layer.

Although the performance/sensitivity of such a photodiode structure is undoubtedly improved, at the same time as retaining a high bandwidth, this approach ignores the appearance of stray capacitance that is added to the capacitance of the stud of the intrinsic layer and tends to limit the bandwidth of the photodiode.

SUMMARY OF THE INVENTION

The present invention aims to alleviate the aforementioned disadvantages at least in part.

To this end, the present invention proposes a PIN structure semiconductor optical receiver comprising a first contact layer, a second contact layer and an intrinsic layer in the form of a stud disposed between the first electrical contact layer and the second electrical contact layer, the first and second contact layers having dimensions in a plane perpendicular to the axis of the stud greater than the cross section of the stud, wherein the first and second electrical contact layers are of elongate shape and are offset angularly relative to each other to minimize the facing areas of the two electrical contact layers.

In fact, the stray capacitance is proportional to the facing area of the two electrical contact layers. The above features therefore minimize this facing area and thus limit the effects of the stray capacitance.

The semiconductor optical receiver may also have the following features separately or in combination:

In one embodiment, the first electrical contact layer has a rectangular shape.

In another embodiment, the first electrical contact layer has a rectangular shape with rounded corners.

The second contact layer may have a rectangular shape or a rectangular shape with rounded corners.

Alternatively, the second contact layer may have a circular shape at the centre with lateral lobes.

For example, the circular shape at the centre of the second contact layer may have a diameter slightly greater than the diameter of the stud.

The offset of the longitudinal axes of the two contact layers may be 90°.

In accordance with one aspect of the invention the intrinsic layer may be produced in germanium, InGaAs or InP.

In accordance with another aspect of the invention the intrinsic layer has a thickness between 1 µm and 2 µm.

The stud of the intrinsic layer has a cylindrical shape or a frustoconical shape, for example.

The thickness of the electrical contact layers may be between 200 nm and 600 nm.

The electrical contact layers are produced in doped silicon, doped InGaAs or doped InP, for example.

BRIEF DESCRIPTION OF THE DRAWINGS

Other advantages and features will become apparent on reading the description of the invention and from the following figures, in which.

DETAILED DESCRIPTION

In all the figures, identical elements bear the same reference numbers.

Figure 1:
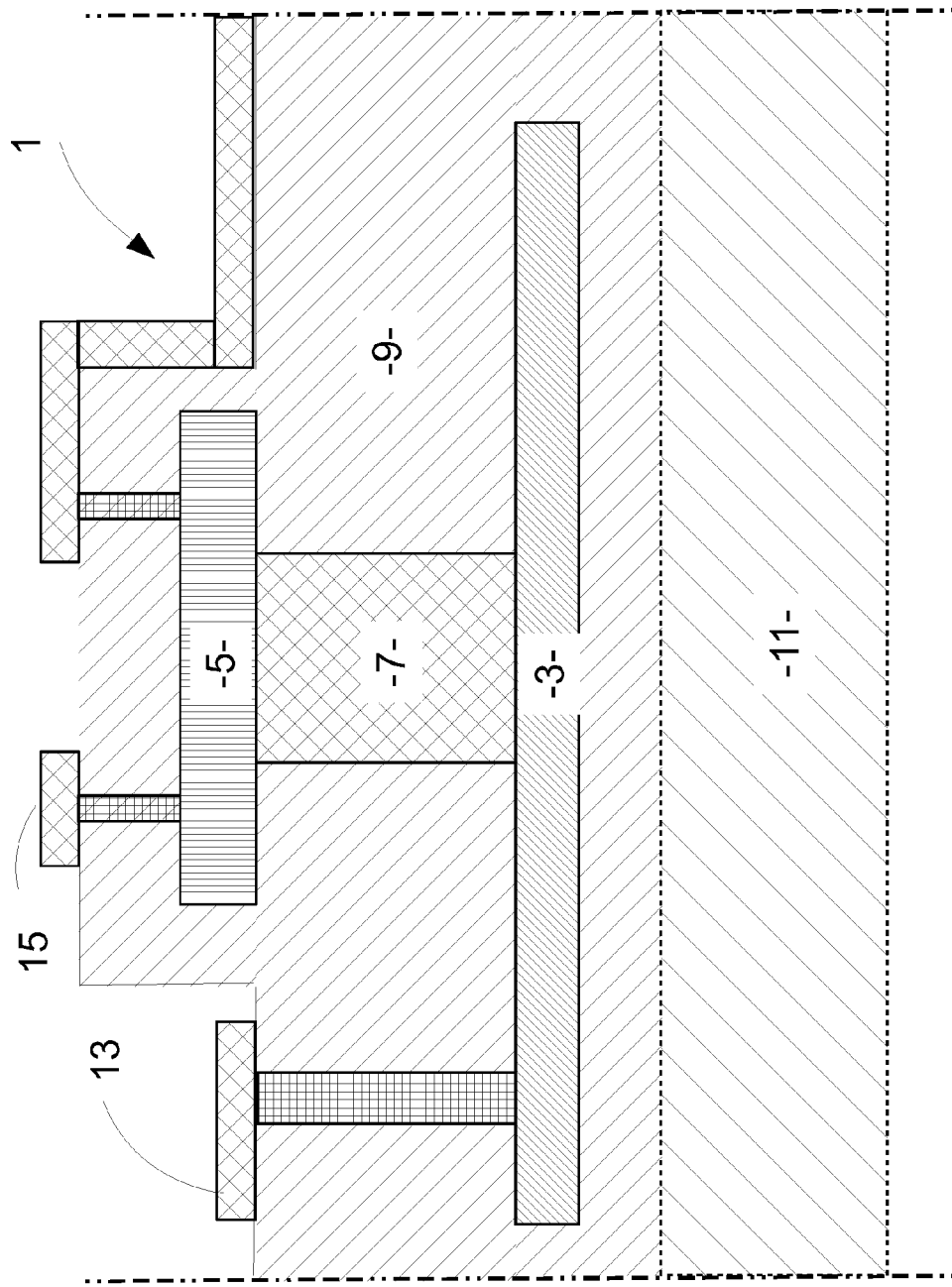
FIG. 1 shows a schematic view of the semiconductor optical receiver in cross section taken along the line I-I in FIGS. 2 and 3.
Figure 2:
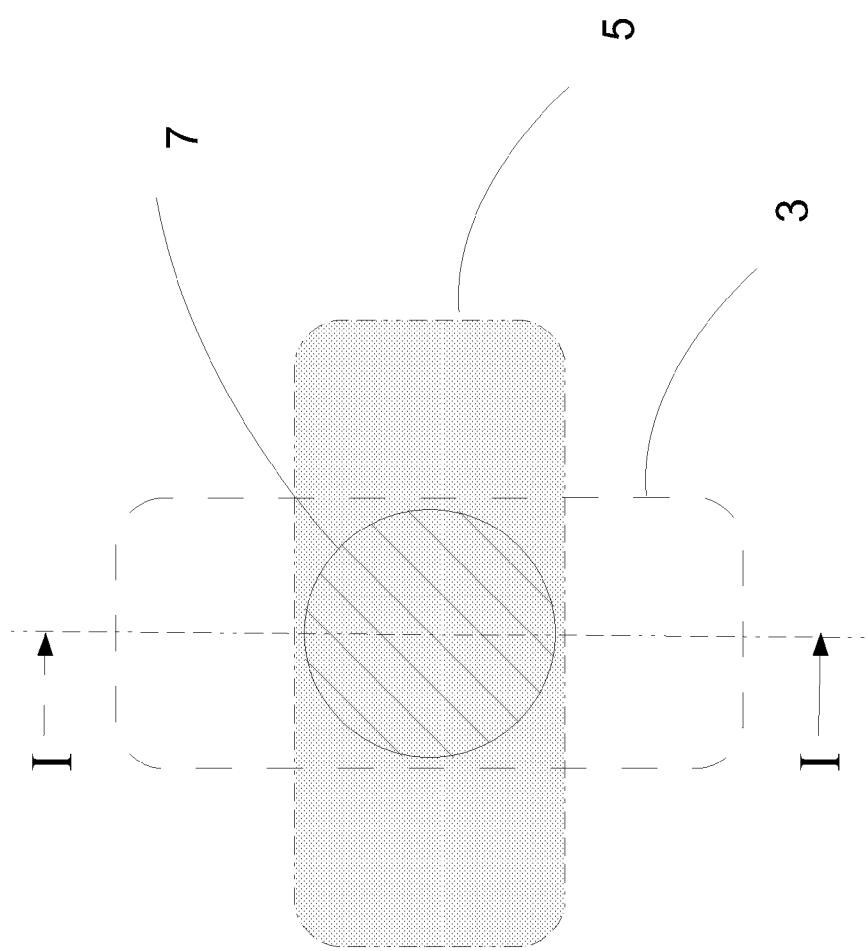
FIG. 2 shows a schematic view of the contours of some stacked semiconductor layers in a first embodiment.
Figure 3:
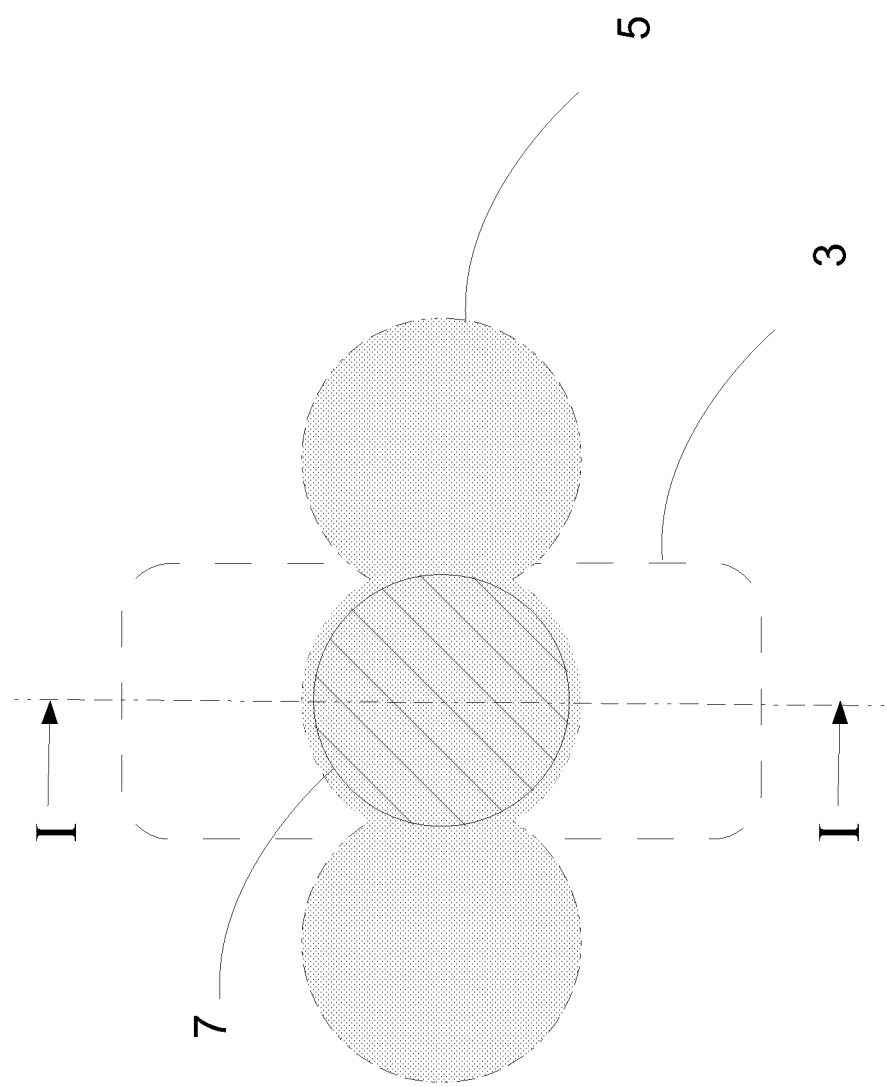
FIG. 3 shows a schematic view of the contours of some stacked semiconductor layers in a second embodiment.

FIG. 1 shows a schematic view in cross section taken along the line I-I in FIGS. 2 and 3 of a PIN structure semiconductor optical receiver 1.

This PIN structure semiconductor optical receiver 1 comprises a first contact layer 3 (the lower contact layer in the figure), a second contact layer 5 (the upper contact layer in the figure) and an intrinsic layer 7 in the form of a stud disposed between the first electrical contact layer 3 and the second electrical contact layer 5.

The intrinsic layer 7 is produced in germanium, InGaAs or InP, for example, and has a thickness between 1 μm and 2 μm.

As seen in the figure, the intrinsic layer 7 has a cylindrical shape.

In a variant that is not represented, the stud of the intrinsic layer can also have a frustoconical shape.

The electrical contact layers are produced in doped silicon, doped InGaAs or doped InP, for example, with one layer p+ doped and the other layer n+ doped, of course.

For example, the layer 3 is produced in p+ doped Si and the layer 5 is produced in n+ doped Si.

The thickness of the electrical contact layer is included in the range 200 nm to 600 nm.

As seen in FIG. 1, the first and second contact layers 3, 5 have dimensions in a plane perpendicular to the axis of the stud 7 greater than the cross section of the stud (this is discussed in more detail later).

Moreover, this assembly of layers 3, 5 and 7 is surrounded by passivating oxide 9, for example SiO$_2$, SiN or a mixture of SiO$_2$ and SiN, and rests on a substrate layer 11.

Openings have been produced in the passivating oxide layer 9 to produce metal contacts 13 and 15, the metal contact 15 being produced in the form of a metal ring, as described in the above introduction, but with the difference that the diameter of the ring is greater than the diameter of the stud of the intrinsic layer 7, which improves the sensitivity of the optical receiver 1.

FIG. 2 shows a schematic plan view of the contours of some stacked semiconductor layers in a first embodiment, to be more precise the electrical contact layers 3 and 5 and the intrinsic layer 7 in the form of a stud.

The first electrical contact layer 3, the lower layer, is represented by a contour in chain-dotted line.

The second electrical contact layer 5, the upper layer, is represented by a contour in dashed line.

The intrinsic layer 7 is represented by a cross-hatched circle.

As seen in this FIG. 2, the first and second electrical contact layers are of elongate shape and are offset angularly relative to each other to minimize the facing areas of the two electrical contact layers 3 and 5.

In fact, the inventors of the present application have identified a stray capacitance introduced by the oxide 9 around the stud 7 that can degrade the total bandwidth of the optical receiver 1. This stray capacitance is proportional to the facing area of the two electrical contact layers 3 and 5.

Accordingly, to minimize the superposition of these two layers as seen from above, at the same time as achieving the benefit of improved sensitivity and a wide bandwidth, the two contact layers 3 and 5 have an elongate shape and are offset relative to each other, here by 90°.

In FIG. 2, the first and second contact layers 3 and 5 have a rectangular shape, to be more precise a rectangular shape with rounded corners. However, an elliptical shape may also be envisaged, for example, without departing from the scope of the present invention.

For this embodiment, the width of the rectangles is slightly greater than the diameter of the stud of the intrinsic layer 7.

FIG. 3 shows a view similar to that of FIG. 2 of another embodiment.

In this figure the first contact layer 3 has a rectangular shape, to be more precise a rectangular shape with rounded corners, and the second contact layer has a circular shape at the centre with lateral lobes, which makes it possible to minimize further the facing area of the two contact layers 3 and 5.

The circular shape at the centre of the layer 5 has a diameter slightly greater than the diameter of the stud 7.

It is therefore clear that the invention makes it possible to reduce the stray capacitance of the oxide, which makes it possible to improve the bandwidth of the optical receiver in accordance with the invention.

FIGS. 4 to 8 show schematic views in cross section of one example of the steps of a method of fabricating a semiconductor optical receiver in accordance with the invention.

Compared to FIG. 1, it can be seen that in this embodiment the substrate layer 11 is produced by three stacked layers, a CMOS substrate layer 11A, a buried oxide (BOX) layer 11B and a silicon layer 11C.

Figure 4:
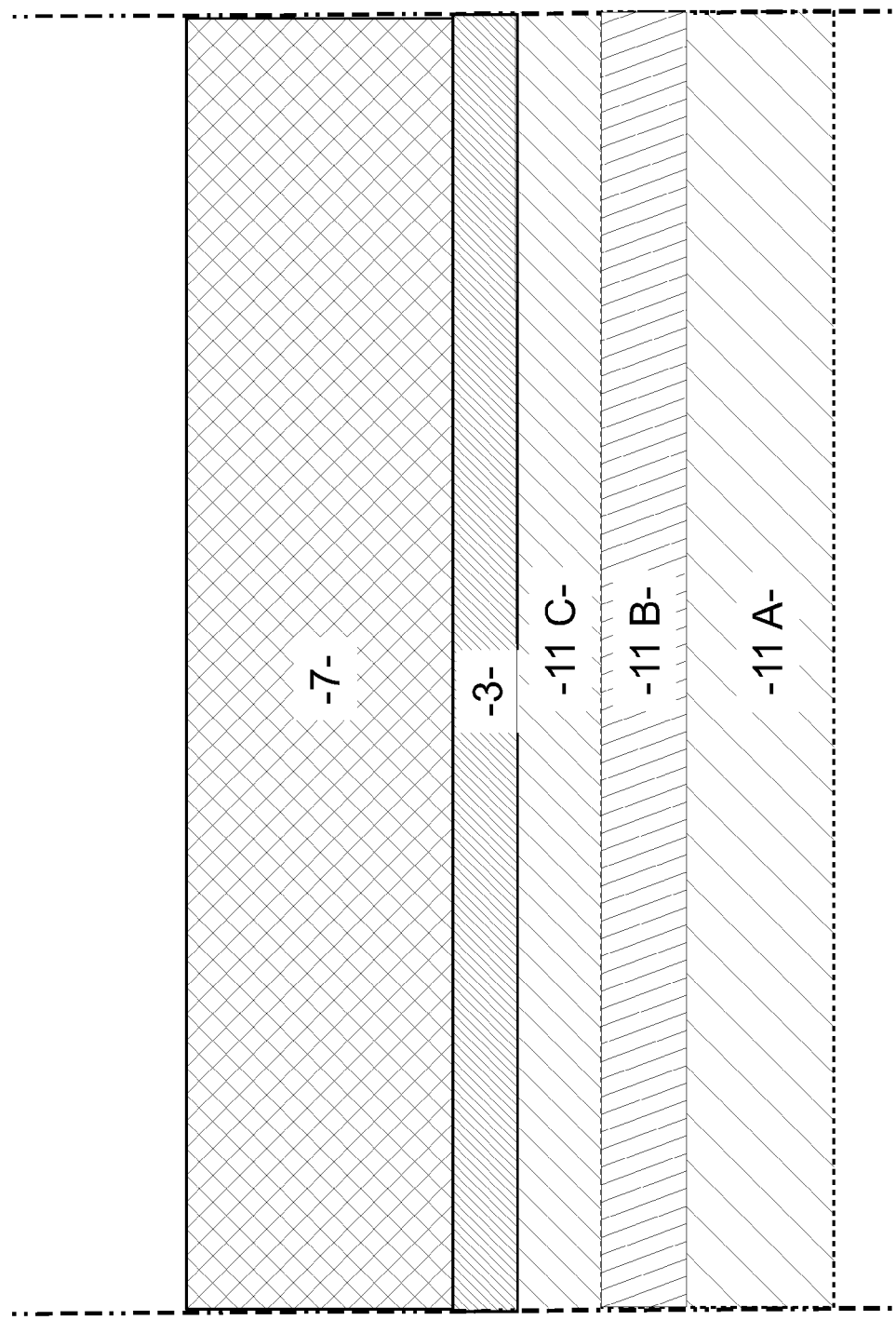
FIGS. 4 to 8 show schematic views in cross section of one example of the steps of a method of fabricating a semiconductor optical receiver in accordance with the invention.

In FIG. 4 there is represented a first step in the fabrication of a semiconductor optical receiver. During this step there are deposited on the silicon layer 11C, for example by full-wafer epitaxy, a layer of p+ doped silicon with a thickness of approximately 200 nm that in the finished product will form the electrical contact layer 3 and a layer of germanium with a thickness of approximately 1.3 μm that in the finished product will form the intrinsic layer 7, the stud.

Figure 5:
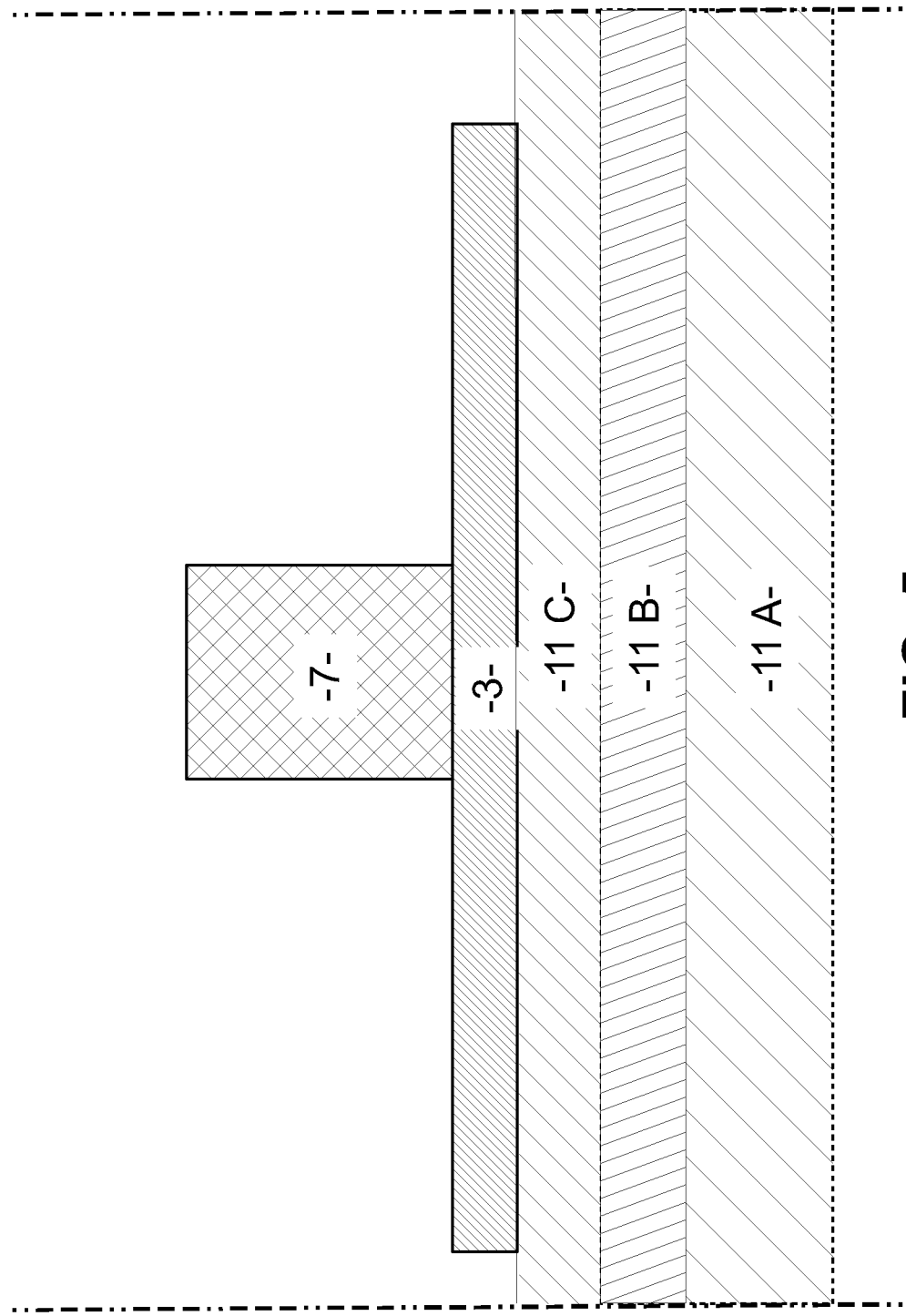

In a second step represented in FIG. 5, the peripheral surplus germanium and p+ doped silicon is removed, for example by lithography and etching, to form on the one hand the stud of the intrinsic layer 7 and on the other hand the electrical contact 3.

The shape of the electrical contact layer 3 as seen from above is that shown in FIG. 2 or 3.

Figure 6:
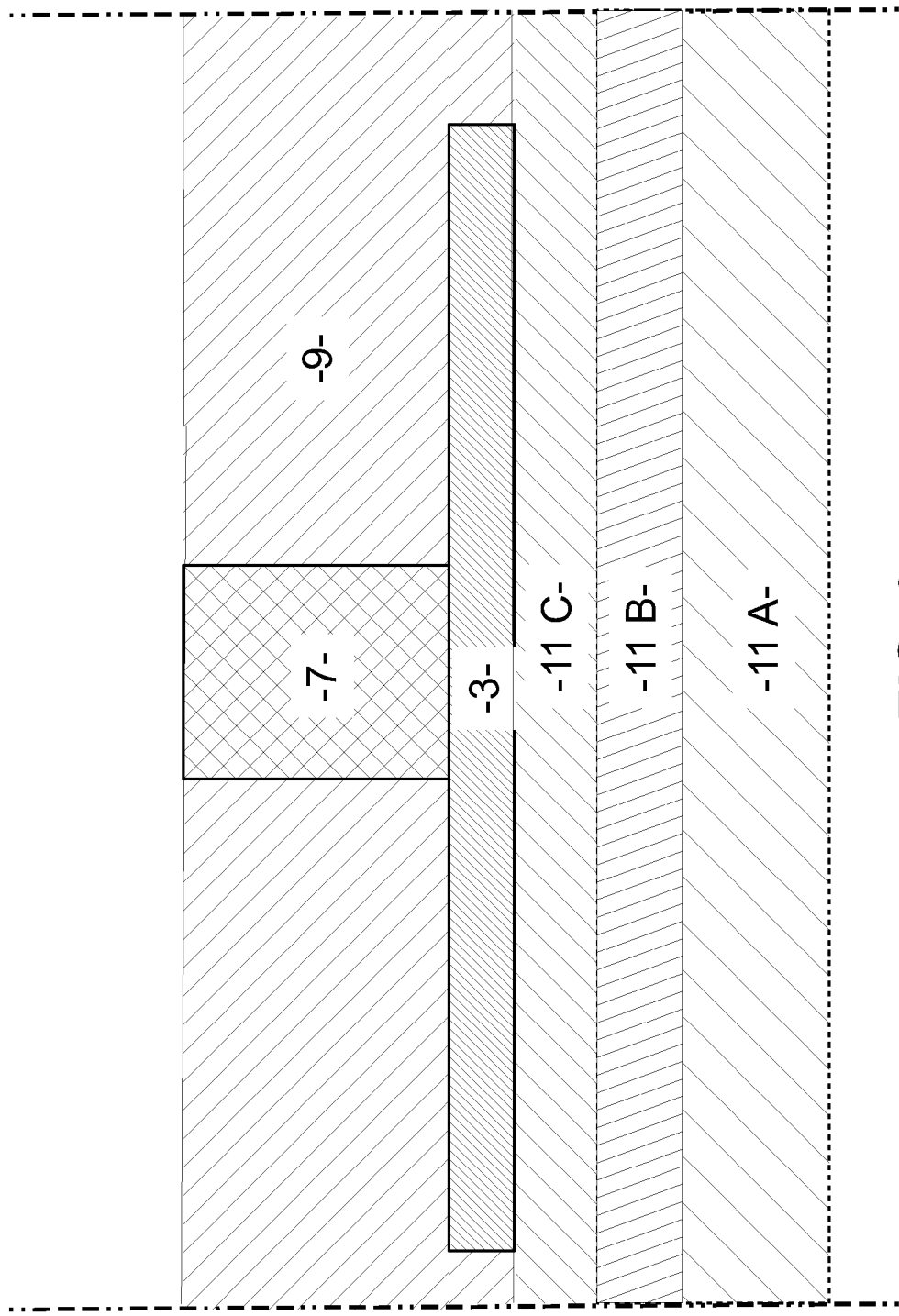

Then, in a third step shown in FIG. 6, both the stud 7 and the electrical contact layer 3 are encapsulated in a passivating oxide layer 9. After this passivating layer 9 is deposited, a flattening step by removal of material ("planing") is effected to obtain a plane surface for the layer 9 and the upper face of the germanium stud 7.

Figure 7:
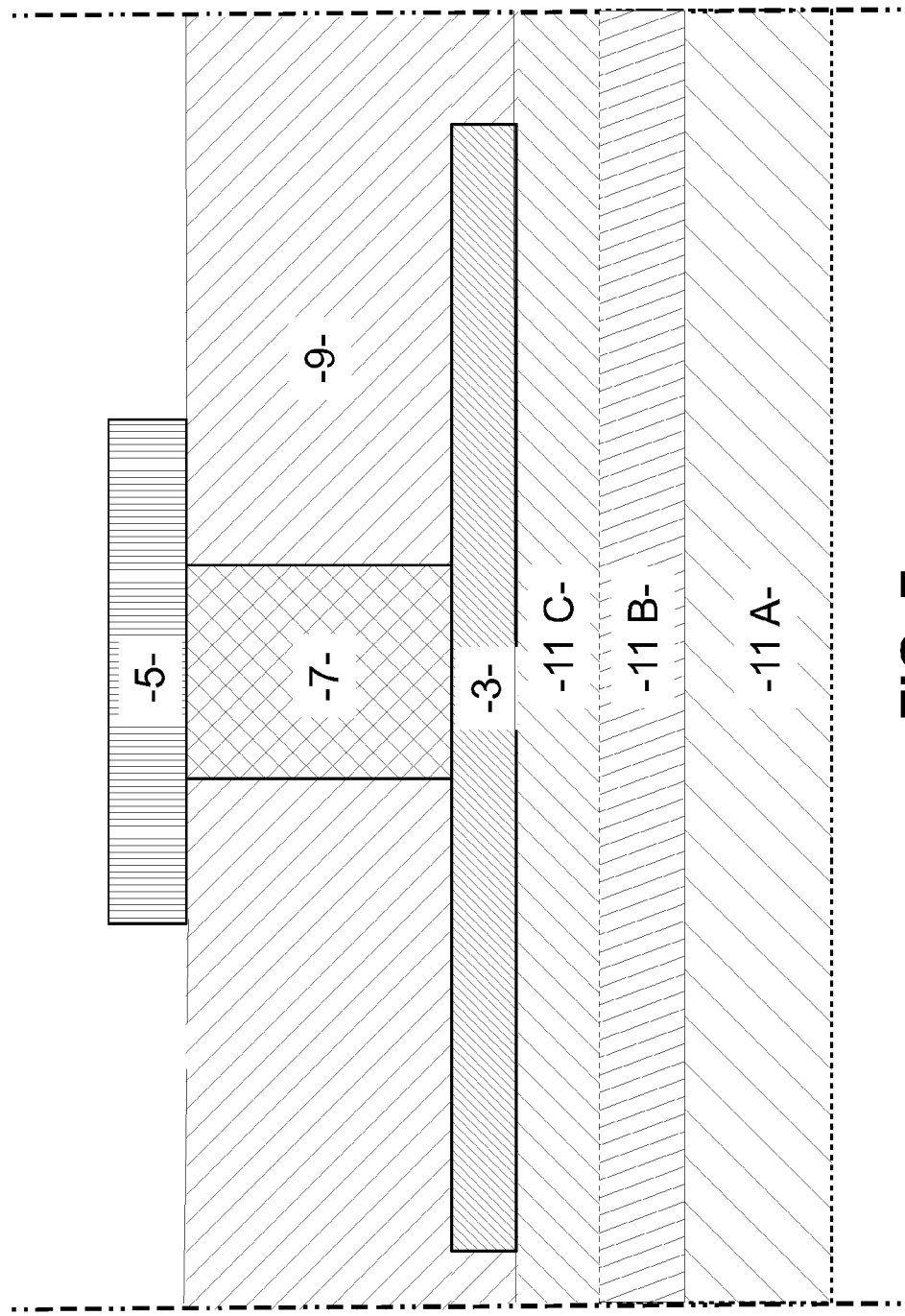

Then, as shown in FIG. 7, full-wafer deposition produces a layer of n+ doped Si with a thickness of approximately 200 nm after which the peripheral surplus is removed by lithography and etching to form the contact layer 5.

The shape of the electrical contact layer 5 as seen from above is that shown in FIG. 2 or 3.

Figure 8:
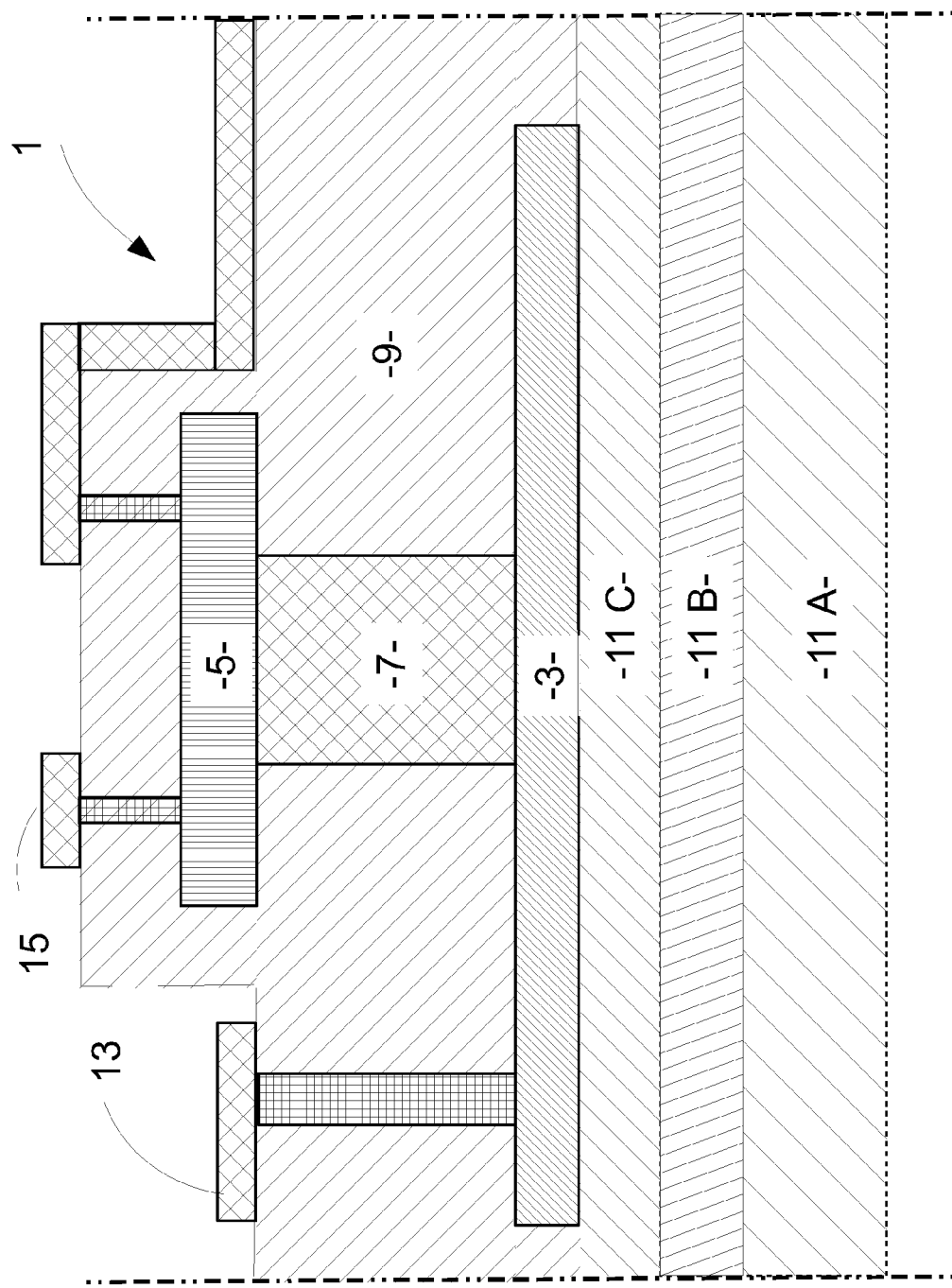

Finally, as shown in FIG. 8, a passivating oxide layer is deposited over the contact layer 5 to encapsulate the latter. A flattening step by removal of material is also carried out.

Openings are then produced in the passivating oxide layer 9 to produce the metal contacts 13 and 15 as described above, by metallization, lithography and etching.

As a function of the thickness of the intrinsic layer 7, a bandwidth of 100 GHz is obtained for a thickness of germanium of 1 μm and a bandwidth of 50 GHz is obtained for a thickness of germanium of 2 μm, for example.

Having described the invention, and a preferred embodiment thereof, what is claimed as new, and secured by Letters Patent is:

1. A PIN structure semiconductor optical receiver comprising: a first electrical contact layer, a second electrical contact layer, and an intrinsic layer disposed between the first electrical contact layer and the second electrical contact layer, said intrinsic layer comprising a stud having a stud axis and a stud cross-section, wherein said first and second contact layers have dimensions in a plane perpendicular to said stud axis that are greater than said stud cross-section, and wherein said first electrical contact layer is elongated in a direction perpendicular to said stud axis and has a first longitudinal axis perpendicular to said stud axis, and said second electrical contact layer is elongated in a direction perpendicular to said stud axis and has a second longitudinal axis perpendicular to said stud axis, said first longitudinal axis being offset angularly from said second longitudinal axis to minimize facing areas of said electrical contact layers, the PIN structure semiconductor optical receiver further comprising a metal contact in the form of a metal ring in contact with said second electrical layer, wherein the diameter of the metal ring is greater than the diameter of the stud of the intrinsic layer.

2. The PIN structure semiconductor optical receiver of claim 1, wherein said first electrical contact layer is rectangular.

3. The PIN structure semiconductor optical receiver of claim 2, wherein said first electrical contact layer is rectangular with rounded corners.

4. The PIN structure semiconductor optical receiver of claim 2, wherein said second electrical contact layer is rectangular.

5. The PIN structure semiconductor optical receiver of claim 4, wherein said second electrical contact layer comprises a rectangular shape with rounded corners.

6. The PIN structure semiconductor optical receiver of claim 2, wherein said second electrical contact layer has a circular shape with lateral lobes.

7. The PIN structure semiconductor optical receiver of claim 6, wherein said circular shape has a diameter slightly greater than a diameter of said stud.

8. The PIN structure semiconductor optical receiver of claim 1, wherein said second electrical contact layer has a circular shape with lateral lobes.

9. The PIN structure semiconductor optical receiver of claim 1, wherein said first electrical contact layer is elliptical.

10. The PIN structure semiconductor optical receiver of claim 1, wherein said first longitudinal axis is offset angularly relative to said second longitudinal axis by 90 degrees.

11. The PIN structure semiconductor optical receiver of claim 1, wherein said intrinsic layer comprises germanium.

12. The PIN structure semiconductor optical receiver of claim 1, wherein said intrinsic layer comprises InGaAs.

13. The PIN structure semiconductor optical receiver of claim 1, wherein said intrinsic layer comprises InP.

14. The PIN structure semiconductor optical receiver of claim 1, wherein said intrinsic layer has a thickness between 1 μm and 2 μm.

15. The PIN structure semiconductor optical receiver of claim 1, wherein the stud is cylindrical.

16. The PIN structure semiconductor optical receiver of claim 1, wherein said stud is frustoconical.

17. The PIN structure semiconductor optical receiver of claim 1, wherein a thickness of an electrical contact layer is between 200 nm and 600 nm.

18. The PIN structure semiconductor optical receiver of claim 1, wherein said electrical contact layers comprise doped silicon.

19. The PIN structure semiconductor optical receiver of claim 1, wherein said electrical contact layers comprise doped InGaAs.

20. The PIN structure semiconductor optical receiver of claim 1, wherein said electrical contact layers comprise doped InP.

* * * * *